(12) United States Patent
Kida

(10) Patent No.: US 7,514,800 B2
(45) Date of Patent: Apr. 7, 2009

(54) SEMICONDUCTOR DEVICE AND WIRE BONDING METHOD THEREFOR

(75) Inventor: Tsuyoshi Kida, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/194,142

(22) Filed: Jul. 12, 2002

(65) Prior Publication Data
US 2003/0011038 A1    Jan. 16, 2003

(30) Foreign Application Priority Data
Jul. 16, 2001    (JP)    ............................. 2001-214954

(51) Int. Cl.
H01L 23/48    (2006.01)
(52) U.S. Cl. .................. 257/784; 257/48; 257/786; 257/692; 257/693; 257/E23.02
(58) Field of Classification Search ................ 257/780, 257/781, 784, 786, 904, E23.015, 48, E23.02, 257/692, 693; 438/617; 349/152
See application file for complete search history.

(56) References Cited

U.S. PATENT DOCUMENTS

| | | | |
|---|---|---|---|
| 5,816,477 A | | 10/1998 | Shimizu |
| 5,925,935 A * | | 7/1999 | Kim ............................ 257/786 |
| 5,962,926 A * | | 10/1999 | Torres et al. ................. 257/786 |
| 6,008,532 A * | | 12/1999 | Carichner ..................... 257/691 |
| 6,037,669 A * | | 3/2000 | Shu et al. ..................... 257/786 |
| 6,291,898 B1 * | | 9/2001 | Yeh et al. ..................... 257/786 |
| 6,348,742 B1 * | | 2/2002 | MacPherson ................ 257/786 |
| 6,373,143 B1 * | | 4/2002 | Bell ............................. 257/786 |
| 6,420,651 B1 * | | 7/2002 | Barrow ........................ 174/52.2 |
| 6,538,336 B1 * | | 3/2003 | Secker et al. ................. 257/786 |
| 6,713,881 B2 * | | 3/2004 | Umehara et al. ............. 257/786 |
| 2002/0185750 A1 * | | 12/2002 | Khan et al. ................... 257/780 |

FOREIGN PATENT DOCUMENTS

JP    61-159758    7/1986

(Continued)

OTHER PUBLICATIONS

English Bibliography and Abstract of JP 3046630 (cited above).

(Continued)

Primary Examiner—Eugene Lee
(74) Attorney, Agent, or Firm—Darryl G. Walker

(57) ABSTRACT

A semiconductor device (10) that may have a wire bonding structure having reduced interference between bond wires and a path of a capillary has been disclosed. Semiconductor device (10) may include bond pads (12) arranged in a line along an edge of a semiconductor chip (14) and conductive fingers (16) arranged on a substrate (18). Bond pads (12) may be electrically connected to conductive fingers (16) with bond wires (20). Bond wires (20) may be divided into a first group having a relatively short length and a second group having a relatively long length. The bond wires (20) in the first group may have bonding points on a bonding pad (12) that is closer to an edge of semiconductor chip (14) than bonding points of bond wires (20) in the second group. In this way, spacing between bond wires (20) already formed and a capillary forming an adjacent bond wire may be increased.

6 Claims, 6 Drawing Sheets

FOREIGN PATENT DOCUMENTS

| | | |
|---|---|---|
| JP | 3046630 | 9/1992 |
| RO | 429489 | 4/2001 |

OTHER PUBLICATIONS

Taiwanese Patent Office Action dated May 13, 2003.
Japanese translation of above-mentioned Taiwanese Patent Office Action dated May 13, 2003.
English translation of indicated portions of the Japanese translation of above-mentioned Taiwanese Patent Office Action dated May 13, 2003.
Korean Office Action of May 20, 2004.
Japanese Translations of the Korean Office Action mentioned above.
English Translations of the indicated portions of the above-referenced Japanese Translation.

* cited by examiner

SEMICONDUCTOR DEVICE AND WIRE BONDING METHOD THEREFOR

TECHNICAL FIELD

The present invention relates generally to a wire bonding method for a semiconductor device and more particularly to a semiconductor device including bonding pads, which may be wire-bonded to lead fingers of a substrate using a capillary.

BACKGROUND OF THE INVENTION

As devices have become smaller and have increased inputs and/or outputs, wire bonding has been used. In wire bonding, a bond wire is used to electrically connect bond pads on a chip with conductive fingers. The conductive fingers provide an electrical connection external to a package.

FIG. 7 is a plan view of a portion of a conventional semiconductor device having bond wires connected to conductive fingers.

FIG. 8 is a side view of the bond wire and a capillary used for setting a bond wire in the conventional semiconductor device of FIG. 7.

Referring now to FIG. 7 in conjunction with FIG. 8, a conventional semiconductor device 60 includes a semiconductor chip 64, a substrate 68, and bond wires 70. Semiconductor chip 64 includes bond pads 62. Substrate 68 includes conductive fingers 66. Each bond pad 62 is connected to a respective conductive finger 66 with a bond wire 70.

Before a semiconductor chip 64 goes through a bonding step to manufacture the conventional semiconductor device 60, a probe step is typically executed. The probe step is executed to test functionality of the semiconductor chip 64. In the probing step, a probe needle (not shown) is brought into contact with surface of the center of each bond pad 62. The probe will generally leave a mark and affect the planarity of the surface of the bond pad 62. Then, in the bonding step, a capillary 72 is used to connect a bond wire 70 to the center of a bond pad 62. In this way, a bond pad 62 is connected to a conductive finger 66.

Bond pads 62 can be arranged in a line near the edge of semiconductor chip 64. Alternatively, bond pads 62 may also be arranged in a zigzag manner near the edge of the semiconductor chip 64. Likewise, the conductive fingers 66 can be lined up along an edge of the substrate 68 or arranged to from a plurality of lines in a zigzag manner. In the example illustrated in FIG. 7, bond pads are arranged in a line near the edge of semiconductor chip 64 and the conductive fingers 66 are arranged to form a plurality of lines in a zigzag manner.

By arranging the conductive fingers 66 to form a plurality of lines in a zigzag manner, bond wires 70 can include short bond wires and long bond wires. Typically, the short bond wires are first bonded to the bond pads 62 and conductive fingers 66. If the long wires are first bonded, the capillary may contact the already bonded long wires when the short wires are bonded to the conductive fingers 66. The maximum diameter of the capillary is typically larger than the width (pitch) of the bond pads 62. Thus, even if there is no contact during the bonding to the bond pad 62, a contact between the bond wire 70 and the capillary can occur when a stitch bond is made to the conductive fingers 66. In view of this problem, the short bond wires 70 are first bonded to connect bond pads 62 to conductive fingers 66. Following this, the long bond wires are bonded to connect bond pads 62 to conductive fingers 66.

However, the conventional bonding method can have the following problems.

A first problem is caused by a probe mark on the surface of a bond pad in generally the same position that the bond wire is to be bonded. The surface of the bond pad in which the probe mark occurs can be rough. If wire bonding is performed on the probe mark, the bond can be unstable. In the conventional example described above, a case is illustrated where bond pads 62 are arranged in a single line. However, even if the bond pads 62 are arranged in a plurality of lines in a zigzag manner, the same problem can occur.

A second problem is that even if the short wires are first bonded to connect the bond pads to the conductive fingers, the capillary can still interfere and contact the short wires when the long wires are bonded.

During the bonding process, a ball (crimp ball) is formed by melting a gold wire with a torch. The capillary then presses the ball against the bond pad. During this process, even if the short wires are formed in advance, the capillary can contact the wires. Typically, there is sufficient space on the side of the conductive fingers so that the capillary rarely creates contact on this side. However, bond pads are arranged along an outer edge of a semiconductor chip in dense manner due to area constraints. When the bond pads are arranged in such a dense manner, there is a high probability that the capillary even interferes and contacts the short wires.

In many cases, the bond wires are arranged in a radial manner around the semiconductor chip. This is because the conductive fingers can have a wider pitch than the pitch of the bond pads. However, if the angle of inclination is increased, as illustrated in FIG. 7, the bond wired may interfere with the moving path of the capillary. Even when there is no difference in the lengths of the bond wires, if the bond wires are arranged in a radial manner (depending on the inclination angles of the bond wires), the capillary can interfere with and contact the bond wires that have been previously formed.

Japanese Patent Publication No. 3,046,630 (in FIG. 1) discloses a semiconductor device in which bond pads include an outer line and an inner line arranged in a zigzag manner. While, such an arrangement may be advantageous from a viewpoint of increasing the density of bond pads, the first above-described problem is not addressed. Namely, the probe marks may still cause unstable or defective bonding.

It should also be noted, that the second above-mentioned problem may not be satisfactorily solved even if the outer line of bond pads are first bonded. On the other hand, if the bond pads in the outer line and the bond pads in the inner line are arranged in a zigzag manner with respect to each other, sufficient space between the bond wire and adjacent bond pads must be provided to ensure that there will be no interference in the bonding process. Thus, the application area of the semiconductor chip may be reduced.

However, even if the bond pads are arranged to form a plurality of lines in a zigzag manner, the capillary may interfere with the bond wires that have been previously formed if the bond pads are densely arranged.

In view of the above discussion, it would be desirable to provide a semiconductor device and wire bonding method. In a wire bonding method, bond pads and bond wires may be connected to each other in succession by using a capillary to supply the bond wire. The bond pads and conductive fingers may be connected to each other while avoiding interference and/or contact between the capillary and already placed bond wires.

It would also be desirable to provide a wire bonding method with which it may be possible to automatically calculate the order of wire bonding in accordance with attributes of bond wires. In this way, the occurrence of interference and contact may be prevented.

It would also be desirable to provide a wire bonding method including a bonding step in which a bond wire may be bonded to a bond pad in an area that may not include a probe mark.

SUMMARY OF THE INVENTION

According to the present embodiments, device that may have a wire bonding structure having reduced interference between bond wires and a path of a capillary is disclosed. The semiconductor device may include bond pads arranged in a line along an edge of a semiconductor chip and conductive fingers arranged on a substrate. Bond pads may be electrically connected to conductive fingers with bond wires. Bond wires may be divided into a first group having a relatively short length and a second group having a relatively long length. The bond wires in the first group may have bonding points on a bonding pad that is closer to an edge of the semiconductor chip than bonding points of bond wires in the second group. In this way, spacing between bond wires already formed and a capillary forming an adjacent bond wire may be increased.

According to one aspect of the embodiments, a semiconductor device may include a plurality of bond pads on a semiconductor chip. The plurality of bond pads may be electrically connected to a plurality of conductive fingers on a substrate with a plurality of bond wires. Each one of the plurality of bond pads may be electrically connected to one of the plurality of conductive fingers with one of the plurality of bond wires. At least some of the plurality of bond pads are arranged so as to be lined up essentially in parallel with an outer edge of the semiconductor chip. A bonding point of the bond wire on at least one of the bond pads is displaced in a direction toward the outer edge of the semiconductor chip with reference to a bonding point of an adjacent bond wire on an adjacent bond pad.

According to another aspect of the embodiments, the bond pads may be arranged to form a plurality of lines along the outer edge of the semiconductor chip. A bonding point of the bond wire on a least one of the bond pads in each line may be displaced in a direction toward the semiconductor chip with reference to a bonding point of an adjacent bond wire on an adjacent bond pad.

According to another aspect of the embodiments, a bonding point of the bond wire on at least one of the plurality of conductive fingers may be displaced in a direction toward the semiconductor chip with reference to a bonding point of an adjacent bond wire on an adjacent conductive finger.

According to another aspect of the embodiments, a bond wire that has the bonding point on the at least one of the bond pads displaced in a direction toward the outer edge of the semiconductor chip may also have the bonding point on the at least one of the conductive fingers displaced in a direction toward the semiconductor chip.

According to another aspect of the embodiments, the plurality of bond wires may be divided into a first bond wire group and a second bond wire group. The first bond wire group may include bond wires that are short wires and have bonding points on respective bond pads that are displaced toward the edge of the semiconductor device as compared to bond wires in the second bond wire group.

According to another aspect of the embodiments, bond wires in the first bond wire group may have a lower height than bond wires in the second bond wire group.

According to another aspect of the embodiments, a semiconductor device may include a plurality of first bond pads and a plurality of first conductive traces. The plurality of first bond wires may be arranged in a first line along a first edge of a semiconductor chip. The plurality of first conductive traces may be formed on a substrate. Each first bond pad may be electrically connected to one of the first conductive traces with a respective first bond wire. The first bond wires may be divided into a first bond wire group and a second bond wire group. The first bond wire group may include first bond wires having bonding points on respective first bond pads that may be offset toward the first edge of the semiconductor chip as compared to bonding points on respective first bond pads electrically connected to first bond wires in the second bond wire group.

According to another aspect of the embodiments, the first bond wires in the second bond wire group may have bonding points on respective first bond pads that may be offset away from the first edge of the semiconductor chip as compared to a center of the respective first bond pad. The first bond wires in the first bond wire group may have bonding points on the respective bond pads that may be offset toward the first edge of the semiconductor chip as compared to a center of the respective first bond pad.

According to another aspect of the embodiments, each first bond pad may include a probe mark in an area away from the bonding point on the first bond pad.

According to another aspect of the embodiments, the first bond wires from the first bond wire group and the second bond wire group may be arranged in alternate order.

According to another aspect of the embodiments, the semiconductor device may include a plurality of second bond pads and a plurality of second conductive traces. The plurality of second bond pads may be arranged in a second line along the first edge of the semiconductor chip. The plurality of second bond pads may be farther away from the first edge of the semiconductor chip than the plurality of first bond pads. The plurality of second conductive traces may be formed on a substrate. Each second bond pad may be electrically connected to one of the second conductive traces with a respective second bond wire. The second bond wires may be divided into a third bond wire group and a fourth bond wire group. The third bond wire group may include second bond wires having bonding points on respective bond pads that may be offset toward the first edge of the semiconductor chip as compared to bonding points on respective second bond pads electrically connected to second bond wires in the fourth bond wire group.

According to another aspect of the embodiments, the second bond wires in the fourth bond wire group may have bonding points on respective second bond pads that may be offset away from the first edge of the semiconductor chip as compared to a center of the respective second bond pad. The second bond wires in the third bond wire group may have bonding points on respective second bond pads that may be offset toward the first edge of the semiconductor chip as compared to a center of the respective second bond pad.

According to another aspect of the embodiments, the first bond pads may be essentially rectangular and may be wider in a direction perpendicular to the first edge of the semiconductor chip than in a direction parallel to the first edge of the semiconductor chip.

According to another aspect of the embodiments, first bond wires in the first bond wire group may have bonding points on respective conductive traces that may be closer to the first edge of the semiconductor chip than bonding points of first bond wires in the second bond wire group on respective conductive traces are close to the first edge of the semiconductor chip.

According to another aspect of the embodiments, first bond wires in the first bond wire group may have a shorter length and a shorter height than the first bond wires in the second bond wire group.

According to another aspect of the embodiments, a semiconductor device may include a plurality of bond pads on a semiconductor. Each one of the plurality of bond pads may be electrically connected to a respective one of a plurality of conductive fingers on a substrate by a respective one of a plurality of bond wires provided from a capillary device. A wire bonding method for the semiconductor device may include the steps of grouping the bond wires into a relatively short first wire group and a relatively long second wire group in accordance with a distance between the respective bond pad and conductive finger in which the bond wire is to be bonded and bonding at least one of the bond wires in the first wire group at a bonding point offset from a center of the respective bond pad in a direction toward an edge of the semiconductor device between the respective bond pad and the respective conductive finger to be electrically connected to the respective bond wire.

According to another aspect of the embodiments, the wire bonding method may further include the step of bonding at least one of the bond wires in the second wire group at a bonding point offset from a center of the respective bond pad in a direction away from an edge of the semiconductor device between the respective bond pad and the respective conductive finger to be electrically connected to the respective bond wire.

According to another aspect of the embodiments, the bond wires may be alternatively arranged between a bond wire of the first wire group and a bond wire of the second wire group.

According to another aspect of the embodiments, the step of grouping may include grouping the bond wires into a middle third wire group in accordance with a distance between the respective bond pad and conductive finger in which the bond wire is to be bonded. Bonding at least one of the bond wires in the third wire group in essentially the middle of the respective bond pad.

According to another aspect of the embodiments, when a first bond wire in the first wire group is adjacent to a second bond wire in the second wire group, bonding of the first bond wire may be performed before bonding of the second bond wire.

DETAILED DESCRIPTION OF THE EMBODIMENTS

Various embodiments of the present invention will now be described in detail with reference to a number of drawings.

Figure 1:
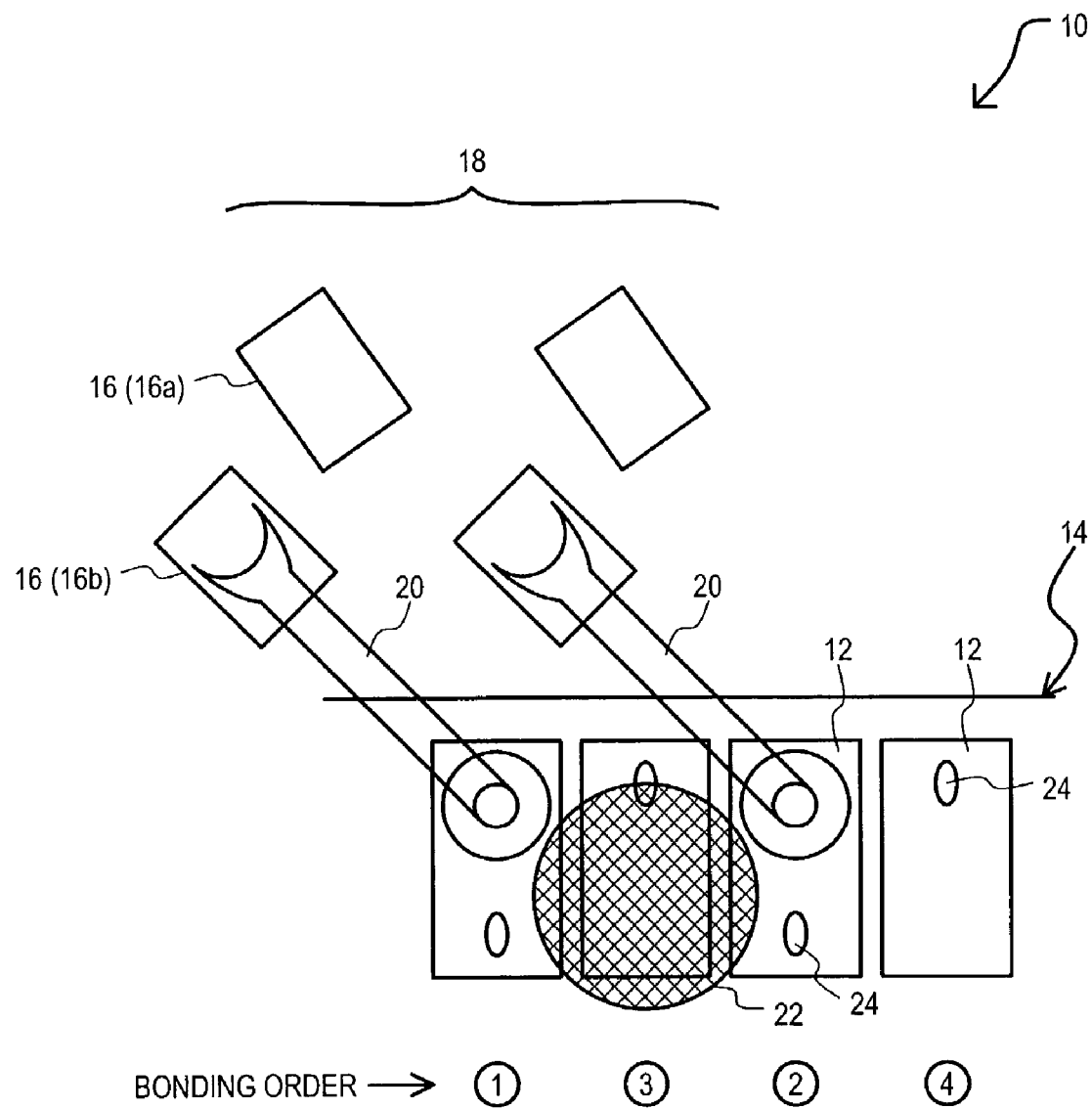
FIG. 1 is a top plan view of a semiconductor device according to a first embodiment.

Referring now to FIG. 1, a top plan view of a semiconductor device according to a first embodiment is set forth and given the general reference character 10.

Semiconductor device 10 may include a semiconductor chip 14, a substrate 18, and bond wires 20.

Semiconductor chip 14 may have a rectangular shape and may include bond pads 12. Substrate 18 may have conductive fingers 16 arranged thereon. A bond pad 12 may be electrically connected to a respective conductive finger 16 by a bond wire 20.

Bond pads 12 may be arranged along outer edges of all four sides of semiconductor chip 14. Bond pads 12 on each side may be arranged in a line and essentially parallel to an edge of the semiconductor chip 14. Each bond pad 12 may have a rectangular shape. The rectangular shape may be longer in the direction orthogonal to the essentially parallel edge of the semiconductor chip 14 than in the direction parallel to the essentially parallel edge of the semiconductor chip 14. However, the rectangular shape is just an example and bond pads 12 may have a different shape.

Conductive fingers 16 may have a shape that is well known. The number of conductive fingers 16 may correspond to the number of bond pads 12. However, in some cases, some bond pads 12 may not be bonded. In that case, the number of conductive fingers 16 may be less than the number of bond pads 12. Conductive fingers 16 may form a plurality of conductive lines on the substrate 18. Substrate 18 may essentially surround semiconductor chip 14 and conductive fingers 16 may provide an electrical connection external to the semiconductor device 10. The length/width of substrate 18 may be greater than the length/width of semiconductor chip 14.

Bond wires 20 may establish electrical connections between respective bond pads 12 and conductive fingers 16. Substrate 18 may be larger and surround semiconductor chip 14, so that respective bond wires 20 may be substantially formed in a radial manner with respect to semiconductor chip 14. Inclination angles of bond wires 20 (with respect to an edge of semiconductor chip 14) may increase in accordance with proximity to a corner of the semiconductor chip and/or a corner of the substrate 18. By providing conductive fingers 16 in a radial manner so that bond wires 20 may have an inclination angle, spacing between adjacent bond wires 20 may gradually increase in a direction from bond pad 12 to conductive finger 16.

Conductive fingers 16 may be divided into conductive fingers 16b that may be closer to semiconductor chip 14 and conductive fingers 16a that may be farther from semiconductor chip 14. Bond wires 20 may be divided into a first group that may be relatively short (bond wires 20 connected to conductive fingers 16b) and a second group that may be relatively long (bond wires (not illustrated) connected to conductive fingers 16a). A bond wire 20 may be bonded at a different position (location) on a respective bond pad 12 in accordance with whether the bond wire 20 is in the first group or the second group. A bond wire 20 from the first group (relatively short) may be connected at a position on a respective bond pad 12 that is closer to the edge of semiconductor chip 14. A bond wire 20 from the second group (relatively long) may be connected at a position on a respective bond pad 12 that is farther from the edge of semiconductor chip 14. In other words, a bond wire 20 from the first group may be connected to a respective bond pad 12 at a position that is closer to conductive fingers 16 than a distance between a position on a respective bond pad 12 that a bond wire 20 from the second group is connected and conductive fingers 16.

As illustrated in FIG. 1, a bonding position of a bond wire 20 from the first group may be positioned in an area offset from the center of bond pad 12 in a direction toward the closest edge of semiconductor chip 14. Also, a bonding position of a bond wire 20 from the second group may be positioned in an area offset from the center of bond pad 12 in a direction away from the closest edge of semiconductor chip 14. However, a bonding position of either a bond wire 20 from the first group or from the second group may be positioned at the center of a bond pad 12, as just one example.

Figure 4A:
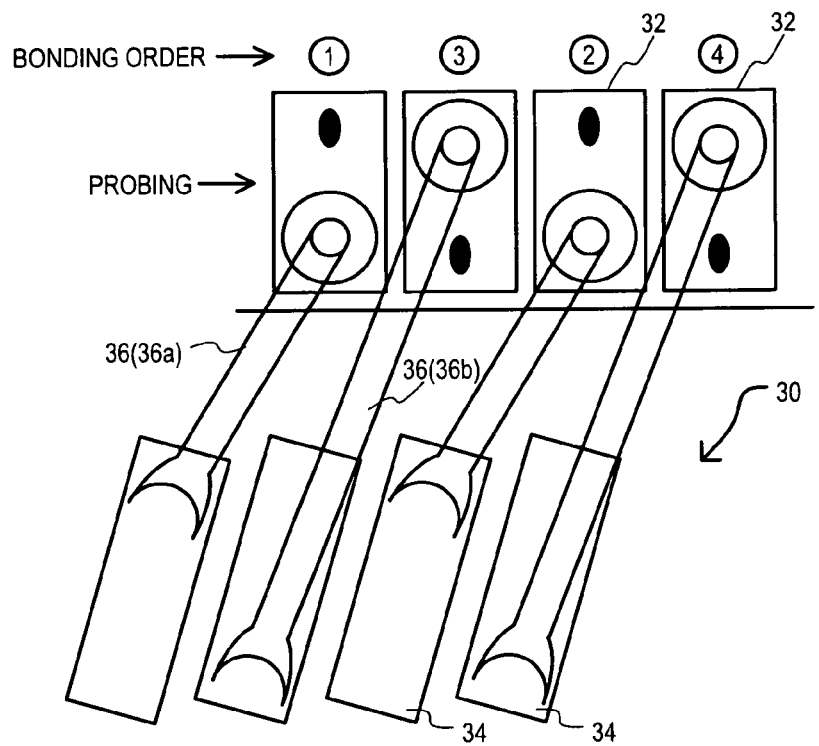
FIG. 4A is a top plan view of a semiconductor device according to a second embodiment.

Referring now to FIG. 4A, a top plan view of a semiconductor device according to a second embodiment is set forth and given the general reference character 30.

Semiconductor device 30 may include a semiconductor chip having bond pads 32. Bond pads 32 may have a narrow rectangular shape. Each bond pad 32 may have essentially the same shape. Semiconductor device 30 may also include a substrate having conductive fingers 34. Conductive fingers 34 may have a narrow rectangular shape. A bond pad 32 may be electrically connected to a respective conductive finger 34 by a bond wire 36.

Bond pads 32 may be arranged along outer edges of all four sides of semiconductor chip. Bond pads 32 on each side may be arranged in a line and essentially parallel to an edge of the semiconductor chip. The rectangular shape may be longer in the direction orthogonal to the essentially parallel edge of the semiconductor chip than in the direction parallel to the essentially parallel edge of the semiconductor chip.

Conductive fingers 34 may be arranged on the substrate substantially in a radial manner with respect to the semiconductor chip. The substrate may essentially surround the semiconductor chip and conductive fingers 34 may provide an electrical connection external to the semiconductor device 30. Bond wires 36 may establish electrical connections between respective bond pads 32 and conductive fingers 34. In this way, bond wires 36 may also be disposed substantially in a radial manner with respect to the semiconductor chip.

Bond wires 36 may be divided into a first group of bond wires 36a and a second group of bond wires 36b. Bond wires 36a may be relatively short as compared to bond wires 36b. Bond wires 36a may be bonded at a position on a respective bond pad 32 that is closer to the edge of the semiconductor chip and bond wires 36b may be bonded at a position on a respective bond pad 32 that is farther from the edge of the semiconductor chip. Likewise, bond wire 36a may be bonded at a position on a respective conductive finger 34 that is closer to the edge of the substrate (or the outer edge of the semiconductor chip) and bond wire 36b may be bonded at a position on a respective conductive finger 34 that is farther from the edge of the substrate (or the outer edge of the semiconductor chip). Although not shown, there may be a third bond wire group bonded essentially at the center of a bond pad 32 and a conductive finger 34, for example.

By arranging bond wires 36a in a first group having a relatively short length and bond wires 36b in a second group having a relatively long length, a bond wire 36 may have a different vertical displacement (height) in accordance with which group (first or second) in which the bond wire 36 is included. A bond wire 36a from a first group may have a lower height than a bond wire 36b from a second group. In this way, a space between adjacent bond wires 36 may be increased and short circuits may be reduced.

Figure 5:
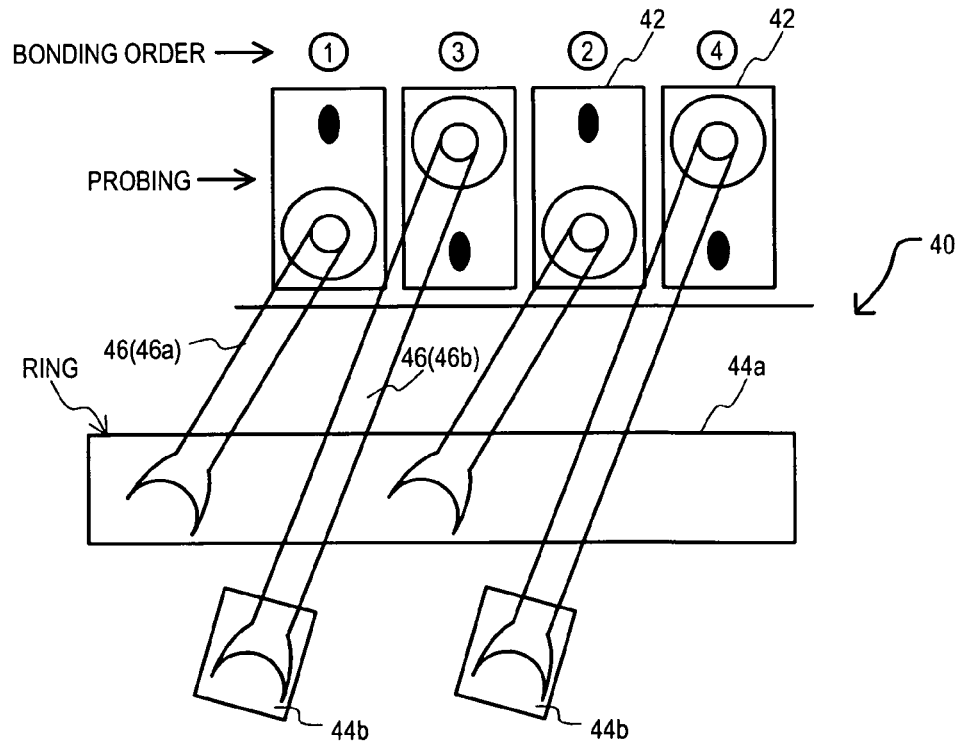
FIG. 5 is a top plan view of a semiconductor device according to a third embodiment.
Figure 8:
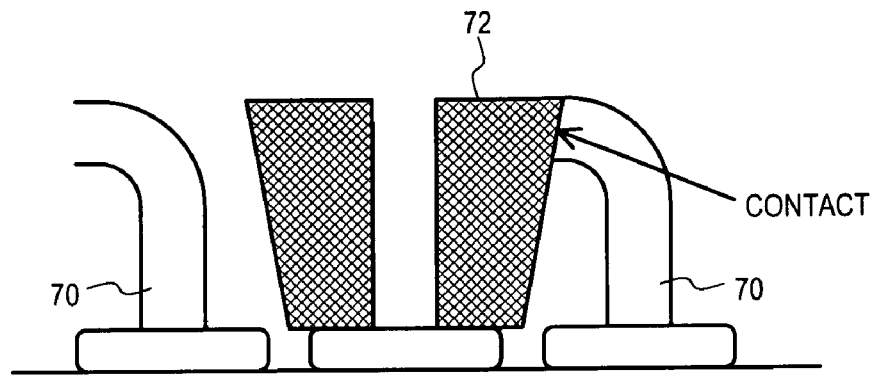
FIG. 8 is a side view of the bond wire and a capillary used for setting a bond wire in the conventional semiconductor device of FIG. 7.

Referring now to FIG. 5, a top plan view of a semiconductor device according to a third embodiment is set forth and given the general reference character 40.

Semiconductor device 40 may include a semiconductor chip having bond pads 42. Bond pads 42 may have a narrow rectangular shape. Each bond pad 42 may have essentially the same shape. Semiconductor device 40 may also include a substrate having conductive fingers (44a and 44b). Conductive finger 44a may be ring shaped and conductive fingers 44b may have an essentially rectangular shape. Conductive finger 44a may be arranged closer to bond pads 42 than conductive fingers 44b. In other words, conductive finger 44a may be between conductive fingers 44b and bond pads 42. However, this relationship may be reversed, for example. A bond pad 42 may be electrically connected to a respective conductive finger (44a and 44b) by a bond wire 46.

Bond pads 42 may be arranged along outer edges of all four sides of semiconductor chip. Bond pads 42 on each side may be arranged in a line and essentially parallel to an edge of the semiconductor chip. The rectangular shape may be longer in the direction orthogonal to the essentially parallel edge of the semiconductor chip than in the direction parallel to the essentially parallel edge of the semiconductor chip.

In accordance with the embodiment of FIG. 5, by including conductive finger 44a having a ring shape and conductive fingers 44b having a rectangular shape, bond wires 46 may be separated into a first group of bond wires 46a and a second group of bond wires 46b. Bond wires 46a may be relatively short as compared to bond wires 46b. Bond wires 46a may be bonded at a position on a respective bond pad 42 that is closer to the edge of the semiconductor chip and bond wires 46b may be bonded at a position on a respective bond pad 42 that is farther from the edge of the semiconductor chip. Also, the other end of bond wire 46a may be bonded to conductive finger 44a. While the other end of each bond wire 46b may be bonded to a conductive finger 44b that is farther from the edge of the substrate (or the outer edge of the semiconductor chip) than conductive finger 44a.

By arranging bond wires 46a in a first group having a relatively short length and bond wires 46b in a second group having a relatively long length, a bond wire 46 may have a different vertical displacement (height) in accordance with which group (first or second) in which the bond wire 46 is included. A bond wire 46a from a first group may have a lower height than a bond wire 46b from a second group. In this way, a space between adjacent bond wires 46 may be increased and short circuits may be reduced.

Conductive finger 44a having a ring shape may be used to provide a power supply potential, such as VDD or VSS, for example, to a semiconductor chip.

The arrangement illustrated in the embodiment may be useful for semiconductor device having a BGA (ball grid array), as just one example.

Figure 6:
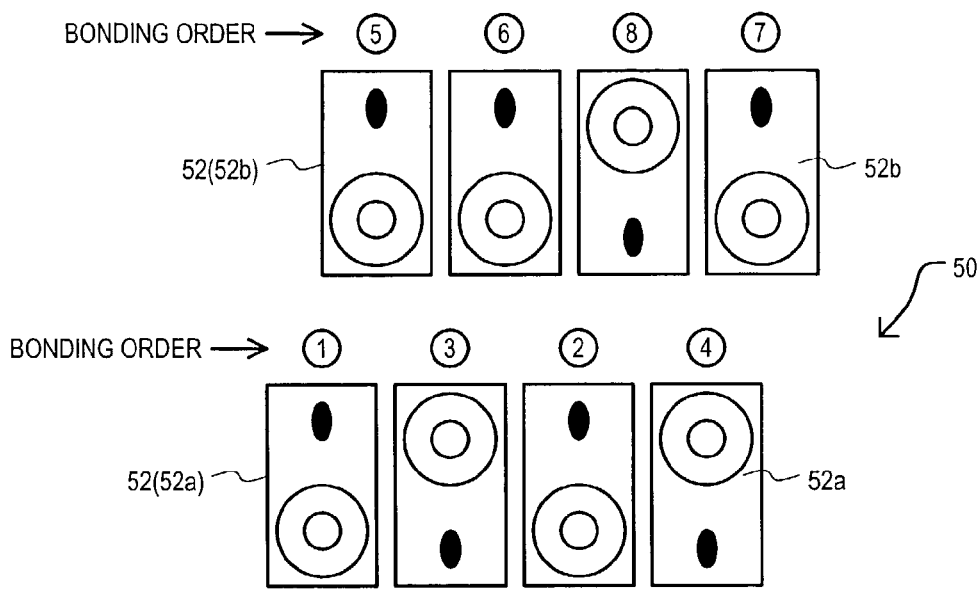
FIG. 6 is a top plan view of a semiconductor device according to a fourth embodiment.

Referring now to FIG. 6, a top plan view of a semiconductor device according to a fourth embodiment is set forth and given the general reference character 50.

Semiconductor device 50 may include a semiconductor chip having bond pads 52. Bond pads 52 may have a narrow rectangular shape. Each bond pad 52 may have essentially the same shape. Semiconductor device 50 may also include a substrate having conductive fingers (not shown). A bond pad 52 may be electrically connected to a respective conductive finger by a bond wire (not shown).

Bond pads 52 may be arranged along outer edges of all four sides of the semiconductor chip. Bond pads 52 on each side may be arranged in a plurality of lines that may be disposed essentially in parallel to an edge of the semiconductor chip. Bond pads 52 may be divided into bond pads 52a formed in an outer line and bond pads 52b formed in an inner line with the outer line being closest to an edge of the semiconductor chip. Bond pads 52a in the outer line and bond pads 52b in the inner line may be formed in a zigzag pattern with respect to each other. In other words, bond pads 52a in the outer line may be formed in an offset or phase shifted manner with respect to bond pads 52b in the inner line. In this way, interference and/or contact with bond wires may be reduced. However, bond pads (52a and 52b) may be arranged in the same phase, for example.

For each line of bond pads (52a and 52b) a first group of bond wires and a second group of bond wires may provide an electrical connection to conductive fingers. The first group of bond wires for each line of bond pads (52a and 52b) may be shorter than the second group of bond wires. Each bond wire in the first group of bond wires may be bonded in a position of the bond pad (52a and 52b) that is closer to the edge of the semiconductor chip as compared to the position of the bond pad (52a and 52b) that each bond wire in the second group of bond wires is bonded.

In order to increase the distance between adjacent bond wires, the first group of bond wires bonded to the outer line of bond pads 52a may have an opposite end bonded to a conductive finger closest to the edge of the semiconductor chip (the inner edge of the substrate). The second group of bond wires bonded to the outer line of bond pads 52a may have an opposite end bonded to a conductive finger next closest to the edge of the semiconductor chip (the inner edge of the substrate). The first group of bond wires bonded to the inner line of bond pads 52b may have an opposite end bonded to a conductive finger next closest to the edge of the semiconductor chip (the inner edge of the substrate). The second group of bond wires bonded to the inner line of bond pads 52b may have an opposite end bonded to a conductive finger farthest from the edge of the semiconductor chip (the inner edge of the substrate). In this way, the first group of bond wires connected to the outer line of bond pads 52a may have the shortest length (and height). The second group of bond wires connected to the outer line of bond pads 52a may have the second shortest length (and height). The first group of bond wires connected to the inner line of bond pads 52b may have the third shortest length (and height). The second group of bond wires connected to the inner line of bond pads 52b may have the longest length (and height). In this way, the distance between adjacent bond wires 52 may be increased.

Although not shown, bond pads 52 may exist in which a bond wire is bonded essentially in the center of the bond pad 52.

Next, a wire bonding method will be described. The method according to the present embodiments may include a computation step (a step of grouping wires), a probing step, and a wire bonding step.

Figure 2:
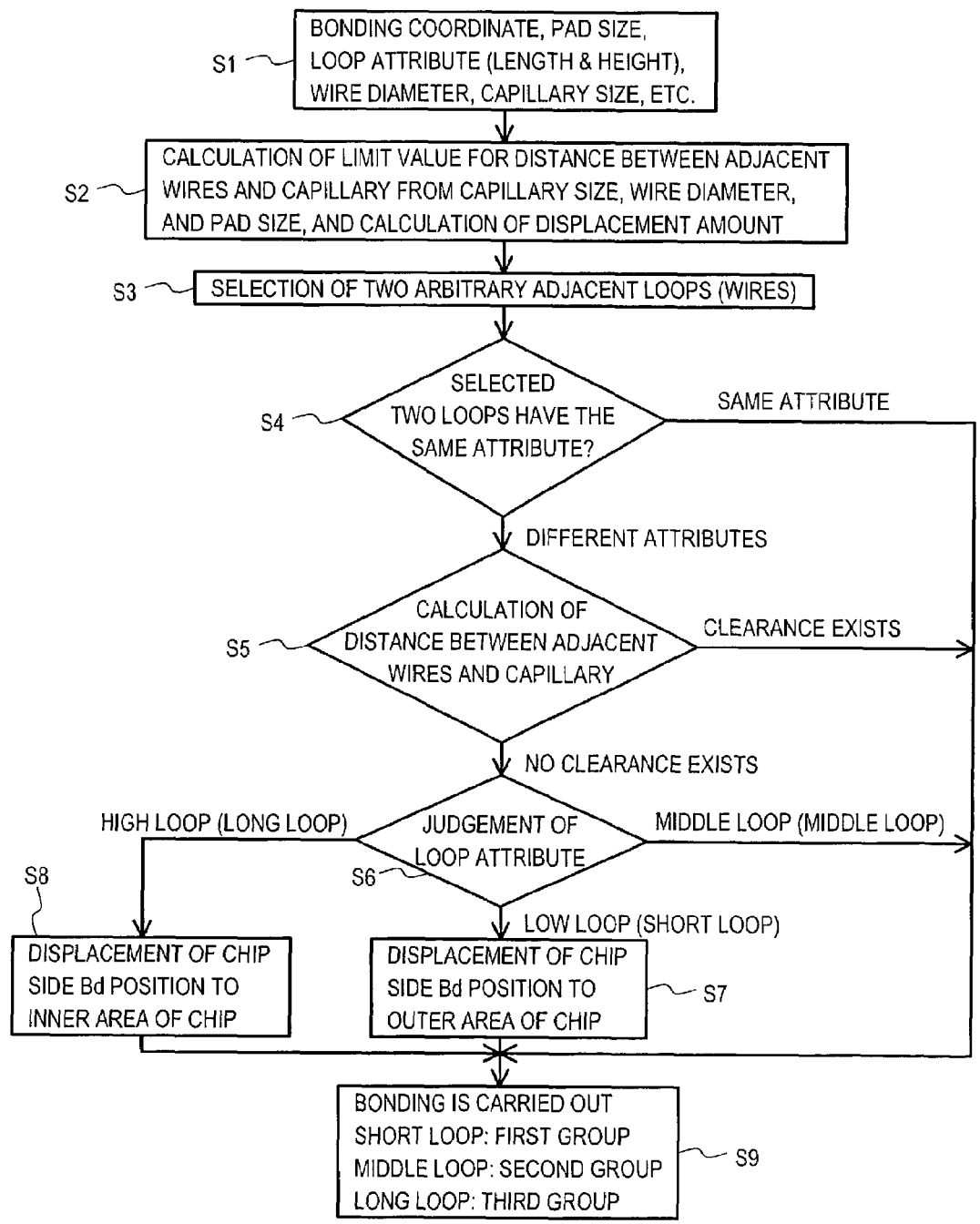
FIG. 2 is a flowchart showing a computation step according to an embodiment.

Referring now to FIG. 2, a flowchart showing a computation step according to an embodiment is set forth.

A semiconductor chip and a substrate may be initially given and a manufacturing apparatus may be determined. Other constant characteristics, such as a pad size, the diameter of a bond wire, and the size of a capillary may be given values. Following this, in step S1, initial bonding coordinates corresponding to bonding points on bond pads may be determined. The initial bonding points may be set at a center of a bond pad. At this stage, initial loop attributes may be determined. Loop attributes can include a length and a height of each bond wire. Loop attributes may be determined by each space between a bonding point on a bond pad and a bond point on a respective conductive finger.

When the bonding point on the bond pad and the loop attributes are determined for each wire, a wire track may be determined. At the same time, the moving path of the capillary may be determined. In FIG. 1, hatched area 22 may represent an area taken up by the capillary at a bonding point at a bond pad during the bonding process.

Figure 7:
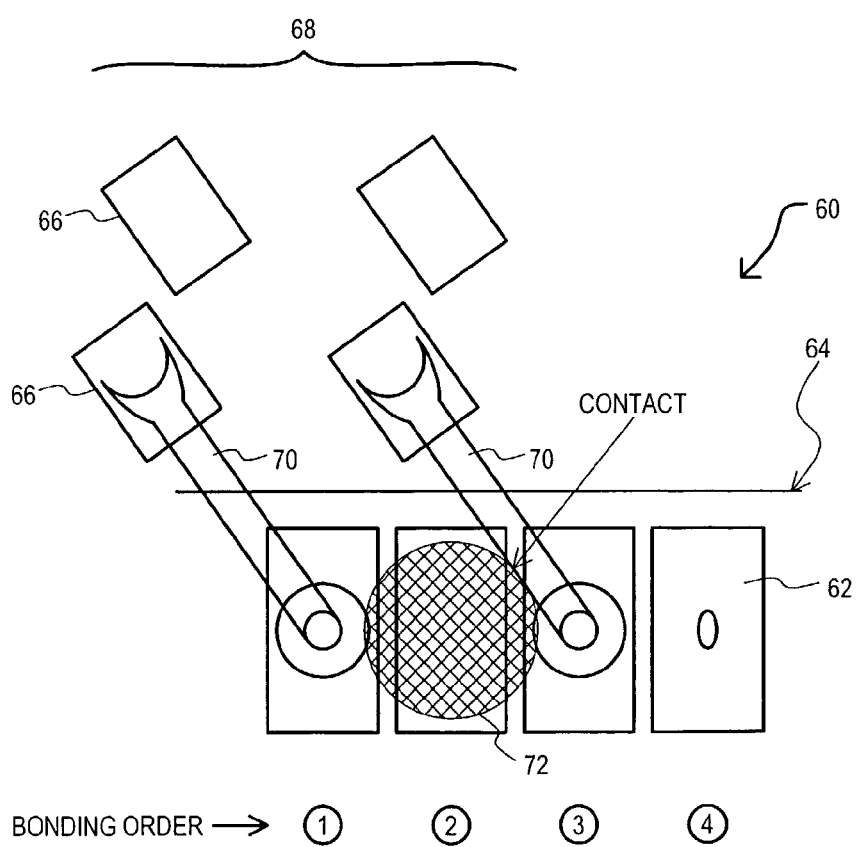
FIG. 7 is a plan view of a portion of a conventional semiconductor device having bond wires connected to conductive fingers.

In step S2, a limit value for a distance between adjacent bond wires and the capillary may be calculated. A displacement amount may then be calculated to obtain a distance that is at least equal to a calculated limit value. The displacement amount may correspond to an amount that a bonding point on a bond pad may be offset from the center. In this way, contact between the capillary and an adjacent bond wire (as illustrated in FIG. 7) may be eliminated.

In step S3, adjacent wires may be arbitrarily selected and it may be determined whether the adjacent bond wires have the same loop attributes at step S4. For example, the same loop attribute may occur in a case where conductive fingers 16 are arranged in a single line and the bond wires essentially follow substantially the same track with respect to their respective bond pad 16. This case may occur for bond wires in the vicinity of the center of each side of the semiconductor chip 14. This is a case where a wire track may not interfere with the capillary path. In this case, the initial bond pad side bonding points may not be changed and may then be retained as bonding points.

When selected bond wires have different loop attributes, step S5 may be performed. In step S5, a distance calculation may be performed to determine whether the wire tracks of the selected bond wires interfere with and contact the path of the capillary. If proper clearance exists between the wire tracks of the selected bond wires and the path of the capillary, the initial bonding points on the selected bond pads may not be changed and may be retained as bonding points.

When it has been determined that sufficient clearance does not exist, step S6 may be performed. In step S6, when conductive fingers are arranged in a single line, the bonding point (Bd position) of selected bonding pads may be placed in any of three points. The bonding point of selected bonding pads may be maintained at a center, displaced toward an outer area of the semiconductor chip by a displacement amount, or displaced toward an inner area of the semiconductor chip by the displacement amount. The displacement amount may be determined in step S2, for example. In this way, a bond wire may be a short loop, a middle loop, or a long loop. At the same time, the height attribute for the bond wire may be set. A short loop may have a low height (step S7) a middle loop may be maintained at a middle height (set in initial attributes), and a long loop may have a high height (step S8).

By providing bond wires grouped into short, middle, or long lengths having low, middle, or high heights, respectively, interference between bond wire tracks and the path of the capillary may be prevented (step S9). Note, in FIG. 1, a first bond wire group having a relatively short length and low height and a second bond group having a relatively long length and high height has been illustrated. However, as illustrated in the flowchart of FIG. 2, it may also be possible to provide three differing bond wire groups.

Figure 3:
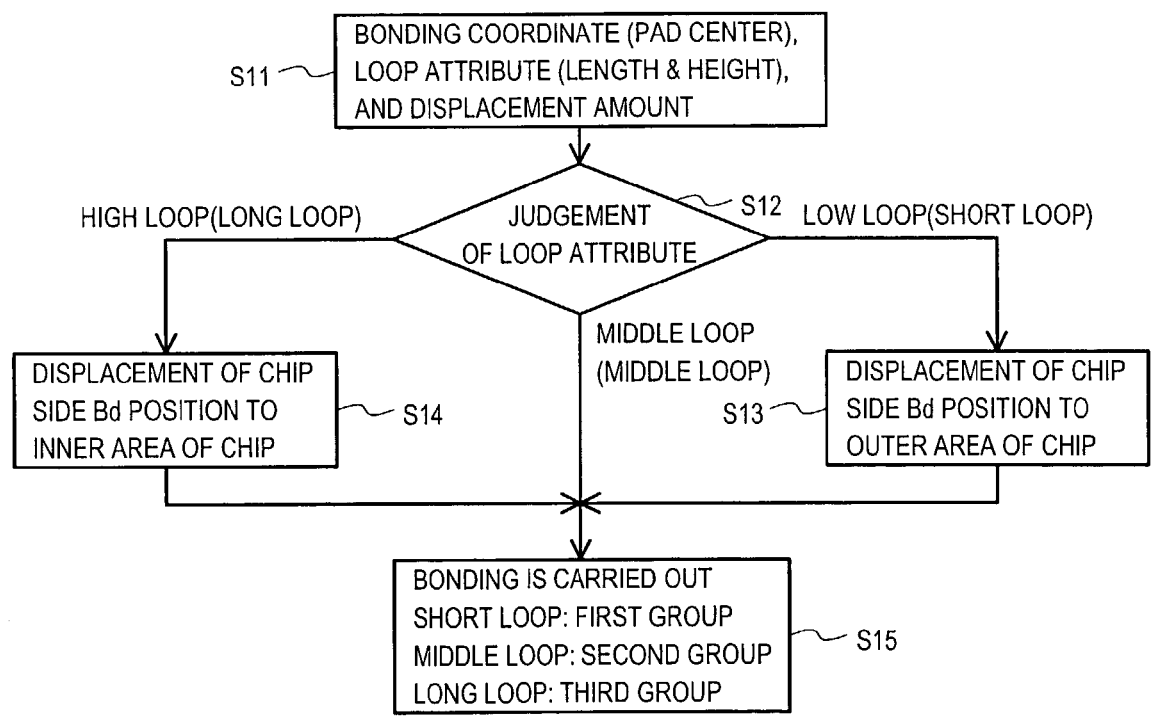
FIG. 3 is a flowchart showing a computation step according to an embodiment.

Referring now to FIG. 3, a flowchart showing a computation step according to an embodiment is set forth. The computation step illustrated in the flowchart of FIG. 3 may be easier to carry out than the computation step illustrated in the flowchart of FIG. 2.

In step S11, initial bonding coordinates corresponding to bonding points on bond pads may be determined. The initial bonding points may be set at a center of a bond pad. At this stage, initial loop attributes may be determined. Loop attributes can include a length and a height of each bond wire. Loop attributes may be determined by each space between a bonding point on a bond pad and a bond point on a respective conductive finger.

In step S12, based on the initial bonding points, a determination for each bond wire as to whether the bond wire is a high-loop wire, a middle-loop wire, or a low-loop wire may be made in accordance based on loop attributes.

A bonding position on a bond pad may then be moved based on the determination made in step S12.

If it has been determined that a bond wire is a low loop wire (short loop), step S13 may be performed. In step S13, the bonding position on the bond pad may be moved toward an outer edge of the semiconductor chip by a displacement amount.

If it has been determined that a bond wire is a middle loop wire (middle loop), the bonding position on the bond pad may be kept at the initial bonding point (center of bond pad).

If it has been determined that a bond wire is a high loop wire (long loop), step S14 may be performed. In step S14, the bonding position on the bond pad may be moved farther from an outer edge of the semiconductor chip by a displacement amount.

In accordance with the above-described flow, bond wires may be grouped into three types in accordance with a general length. In this way, interference between adjacent bond wires and a path of a capillary may be prevented.

Based on bonding positions for each bond pad, probe needle positions for needles on each probe card may be determined. In a probing step, probe needles may be pressed against bond pads 12. As shown in FIG. 1, probe marks 24 may occur due to the probe needles. The bond pad 12 may be damaged in the area in which the probe needles occur. This can affect the later wire bonding step. Thus, the positions on a bond pad at which a probe needle may contact may be set at positions different than the positions of wire bonding points. Thus, a probe card may be designed in accordance to these determined coordinates. In this way, a probing step may be performed without damaging a bond pad in an area in which a wire bond is to be formed in a later bonding step and defects may be reduced.

Referring to FIG. 1, for example, when a probing step has been completed and the semiconductor chip has been determined to pass the characterization tests, bonding may be performed. In semiconductor device 10, the bonding order may be such that the bond wires 20 in the first group (short wires) may be bonded first. Then, bond wires in the second group (long wires) may be bonded. In this way, a situation where the capillary forming bond wires in the first group interferes with a bond wire from the second group may be eliminated.

In a case where the bond wire groups include a group having a bonding point kept at the initial values (essentially a bond pad center), the short wire group may first be bonded to bond pads 12 and conductive fingers 16. Next, the middle wire group having bonding points kept at the initial values may be bonded to bond pads 12 and conductive fingers 16. Last, the long wire group may be bonded to bond pads 12 and conductive fingers 16.

In accordance with the embodiments, a wire bonding structure having reduced interference between bond wires and a path of a capillary may be achieved. This may be accomplished by providing various location on respective bond pads in which a wire bond may be formed. As a result, even when a semiconductor device is manufactured with a semiconductor chip having bond pads lined up in a single line along each edge, it may be possible to maintain sufficient clearance between a track of each bond wire already formed and a path of a capillary used for forming each succeeding bond wire. As a result, it may be possible to improve manufacturability of a semiconductor device by reducing damage and/or deformation of bond wires during a bonding process.

It is understood that the embodiments described above are exemplary and the present invention should not be limited to those embodiments. Specific structures should not be limited to the described embodiments.

Figure 4B:
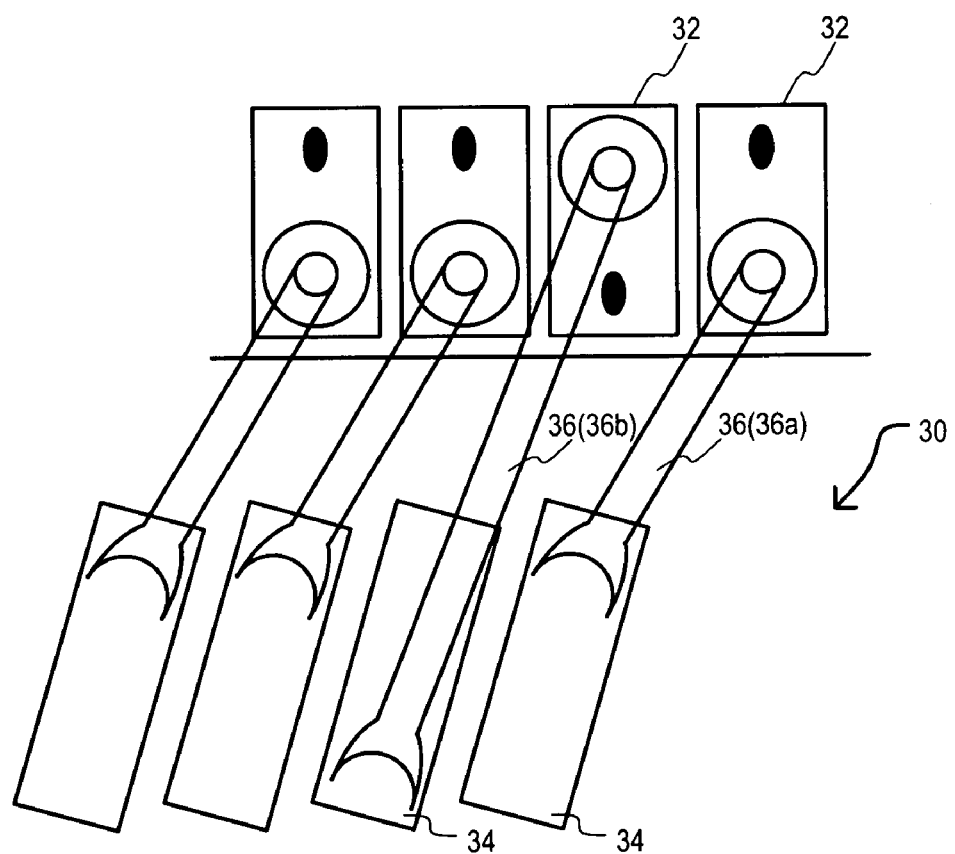
FIG. 4B is a top plan view of a semiconductor device according to the second embodiment having generally random short bond wires and long bond wires.

Although embodiments have been illustrated where a short bond wire and a long bond wire are alternately arranged in providing the bond wires, arrangement of short bond wires and long bond wires may be generally random (FIG. 4B), as just one example.

In embodiments one through four (FIGS. 1, 4A, 5 and 6), each bond pad may include a probe mark, which may be formed in a probing step to verify functionality of the semiconductor chip. The probe mark may be offset from a bonding point in the bond pad. In this way, an electrical connection between a bond wire and a bond pad may be improved.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device, comprising:
  a plurality of first bond pads arranged in a first line along a first edge of a semiconductor chip;
  a plurality of first conductive traces formed on a substrate; and
  each first bond pad is electrically connected to one of the first conductive traces with a respective first bond wire;
  wherein the first bond wires are divided into a first bond wire group and a second bond wire group and the first bond wire group consists of first bond wires having bonding points on respective first bond pads that are offset toward the first edge of the semiconductor chip as compared to bonding points on all respective first bond pads electrically connected to first bond wires in the second bond wire group, the first bond wires from the first bond wire group and the first bond wires from the second bond wire group are arranged in order along the first line such that at least two adjacent ones of the plurality of first bond pads are from the same bond wire group, and
  each first bond pad includes a probe mark in an area away from the bonding point on the first bond pad and an area of the bonding point on the first bond pad does not include a probe mark, the probe marks on first bond pads connected to the first bond wire group are offset away from the first edge of the semiconductor chip and the probe marks on first bond pads connected to the second bond wire group are offset toward the first edge of the semiconductor chip.

2. The semiconductor device according to claim 1, wherein:
  the first bond wires in the first bond wire group have bonding points on respective conductive traces that are closer to the first edge of the semiconductor chip than bonding points on respective conductive traces for the first bond wires in the second bond wire group.

3. The semiconductor device according to claim 1, wherein:

the first bond wires in the second bond wire group have bonding points on respective first bond pads that are offset away from the first edge of the semiconductor chip as compared to a center of the respective first bond pad and the first bond wires in the first bond wire group have bonding points on respective first bond pads that are offset toward the first edge of the semiconductor chip as compared to a center of the respective first bond pad.

4. The semiconductor device according to claim 1, wherein:
the first bond wires in the first bond wire group have a shorter length and a shorter height than the first bond wires in the second bond wire group.

5. The semiconductor device according to claim 1, wherein:
the first bond pads are essentially rectangular and wider in a direction perpendicular to the first edge of the semiconductor chip than in a direction parallel to the first edge of the semiconductor chip.

6. The semiconductor device according to claim 1, wherein:
the first conductive traces have essentially uniform width in a direction parallel to the first edge of the semiconductor chip.

* * * * *